(12) United States Patent
Yamamoto et al.

(10) Patent No.: US 12,214,694 B2
(45) Date of Patent: Feb. 4, 2025

(54) INFORMATION PROCESSING APPARATUS, METHOD AND SYSTEM

(71) Applicant: KABUSHIKI KAISHA TOSHIBA, Tokyo (JP)

(72) Inventors: Takahiro Yamamoto, Tokyo (JP); Kaoru Koiwa, Tokyo (JP); Hisaaki Hatano, Yokohama Kanagawa (JP); Kenichi Fujiwara, Kawasaki Kanagawa (JP); Kohei Maruchi, Tokyo (JP); Koji Takazawa, Tokyo (JP); Yoshiyuki Isozaki, Tokyo (JP); Shun Egusa, Yokohama Kanagawa (JP); Tomokazu Morita, Funabashi Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 787 days.

(21) Appl. No.: 17/249,344

(22) Filed: Feb. 26, 2021

(65) Prior Publication Data
US 2021/0178927 A1    Jun. 17, 2021

Related U.S. Application Data

(63) Continuation of application No. PCT/JP2019/035279, filed on Sep. 6, 2019.

(51) Int. Cl.
| | |
|---|---|
| *H02J 7/00* | (2006.01) |
| *B60L 50/60* | (2019.01) |
| *B60L 53/62* | (2019.01) |
| *B60L 53/66* | (2019.01) |
| *B60L 58/12* | (2019.01) |

(52) U.S. Cl.
CPC ............ *B60L 58/12* (2019.02); *B60L 50/60* (2019.02); *B60L 53/62* (2019.02); *B60L 53/66* (2019.02); *H02J 7/0048* (2020.01); *H02J 7/005* (2020.01); *H02J 7/007194* (2020.01)

(58) Field of Classification Search
CPC ...................................................... H02J 7/005
USPC .......................................................... 320/161
See application file for complete search history.

(56) References Cited

U.S. PATENT DOCUMENTS

| | | | |
|---|---|---|---|
| 4,947,124 A | 8/1990 | Hauser | |
| 6,392,414 B2 * | 5/2002 | Bertness | ............... H01M 10/48 324/429 |
| 7,091,698 B2 | 8/2006 | Yamazaki et al. | |

(Continued)

FOREIGN PATENT DOCUMENTS

| | | |
|---|---|---|
| EP | 3 048 694 A1 | 7/2016 |
| JP | H2-37674 A | 2/1990 |

(Continued)

*Primary Examiner* — Edward Tso
*Assistant Examiner* — Ahmed H Omar
(74) *Attorney, Agent, or Firm* — Finnegan, Henderson, Farabow, Garrett & Dunner, LLP

(57) ABSTRACT

There is provided a rechargeable battery evaluation device including: a charging controller configured to switch charging current of a rechargeable battery being charged with first current to second current; and a first state estimator configured to estimate a state of the rechargeable battery based on a feature of change in at least one of a voltage and a charging amount of the rechargeable battery due to switching from the charging current to the second current.

24 Claims, 11 Drawing Sheets

(56) References Cited

U.S. PATENT DOCUMENTS

| | | | |
|---|---|---|---|
| 9,178,380 B2 | 9/2015 | Schellenberg et al. | |
| 9,213,070 B2 | 12/2015 | Hoshino et al. | |
| 9,895,991 B2 | 2/2018 | Kim et al. | |
| 10,193,195 B2 | 1/2019 | Morita et al. | |
| 2006/0197504 A1* | 9/2006 | Atehortua | G01R 31/392 |
| | | | 320/132 |
| 2011/0060538 A1 | 3/2011 | Fahimi et al. | |
| 2015/0061687 A1* | 3/2015 | Shim | G01R 31/392 |
| | | | 324/426 |
| 2016/0011274 A1 | 1/2016 | Morita et al. | |
| 2016/0214500 A1* | 7/2016 | Kim | H02J 7/0048 |
| 2017/0259687 A1 | 9/2017 | Chikkannanavar et al. | |
| 2019/0018070 A1 | 1/2019 | Yamada | |
| 2019/0195956 A1 | 6/2019 | Lim et al. | |
| 2021/0382114 A1* | 12/2021 | Oyama | G01R 31/378 |

FOREIGN PATENT DOCUMENTS

| | | |
|---|---|---|
| JP | 2000-121710 A | 4/2000 |
| JP | 4061965 B2 | 3/2008 |
| JP | 2012-251806 A | 12/2012 |
| JP | 2013-62905 A | 4/2013 |
| JP | 2014-190763 A | 10/2014 |
| JP | 2016-133513 A | 7/2016 |
| JP | 2017-54696 A | 3/2017 |
| JP | 2017-167073 A | 9/2017 |
| JP | 2018-205230 A | 12/2018 |

* cited by examiner

| TIME | CHARGING AMOUNT (SoC) | VOLTAGE [V] | CURRENT [A] | TEMPERATURE [°C] | IMPULSE FLAG |
|---|---|---|---|---|---|
| t1 | ... | ... | ... | ... | 0 |
| t2 | ... | ... | ... | ... | 0 |
| t3 | ... | ... | ... | ... | 0 |
| ... | ... | ... | ... | ... | ... |
| ta | ... | ... | ... | ... | 1 |
| ... | ... | ... | ... | ... | 1 |
| tb | ... | ... | ... | ... | 1 |
| ... | ... | ... | ... | ... | 0 |
| tc | ... | ... | ... | ... | 1 |
| td | ... | ... | ... | ... | 1 |
| ... | ... | ... | ... | ... | ... |
| tn | ... | ... | ... | ... | 0 |

FIG. 3

REPRESENTATIVE
TEMPERATURE: 25°C, INITIAL SoC:SoCx

| GRADIENT $\Delta V / \Delta SOC$ | BOOST VOLTAGE Vsp | DEGRADATION STATE (SoH) |
|---|---|---|
| ... | ... | ... |
| ... | ... | ... |
| ... | ... | ... |
| ... | ... | ... |
| ... | ... | ... |
| ... | ... | ... |
| ... | ... | ... |
| ... | ... | ... |
| ... | ... | ... |

FIG. 5

CONSTANT CURRENT CHARGING : 1 C

BATTERY TEMPERATURE : 25°C, SoH:SoHx

| SOC | VOLTAGE V | DEGRADATION STATE (SoH) |
|---|---|---|
| 0 | ... | ... |
| 1 | ... | ... |
| ... | ... | ... |
| ... | ... | ... |
| ... | ... | ... |
| ... | ... | ... |
| ... | ... | ... |
| ... | ... | ... |
| 100 | ... | ... |

FIG. 6

CONSTANT CURRENT CHARGING : 0.2C

TEMPERATURE : 25°C, SoH:SoHx

| SOC | VOLTAGE V | DEGRADATION STATE (SoH) |
|---|---|---|
| 0 | ... | ... |
| 1 | ... | ... |
| ... | ... | ... |
| ... | ... | ... |
| ... | ... | ... |
| ... | ... | ... |
| ... | ... | ... |
| ... | ... | ... |
| 100 | ... | ... |

INFORMATION PROCESSING APPARATUS, METHOD AND SYSTEM

CROSS REFERENCE TO RELATED APPLICATIONS

This application is a Continuation of International Application No. PCT/JP2019/035279, filed on Sep. 6, 2019, the entire contents of which is hereby incorporated by reference.

FIELD

Embodiments described herein relates to a rechargeable battery evaluation device, a rechargeable battery evaluation method, and a rechargeable battery evaluation system.

BACKGROUND

Recently, it has been expected that a rechargeable battery is used as a battery device that is used in a distributed power storage system and can be charged and discharged. It has been required to evaluate the state of the rechargeable battery to maintain and stabilize the quality of the electrical power system.

BRIEF DESCRIPTION OF THE DRAWINGS

FIG. 3 is a diagram illustrating exemplary data stored in a charging measurement DB;

FIG. 5 is a diagram illustrating an exemplary degradation DB;

FIG. 6 is a diagram illustrating an exemplary first charging data DB;

FIG. 7 is a diagram illustrating an exemplary second charging data DB;

DETAILED DESCRIPTION

There is provided a rechargeable battery evaluation device including: a charging controller configured to switch charging current of a rechargeable battery being charged with first current to second current; and a first state estimator configured to estimate a state of the rechargeable battery based on a feature of change in at least one of a voltage and a charging amount of the rechargeable battery due to switching from the charging current to the second current.

Recently, natural energy has been introduced to maintain and stabilize the quality of an electrical power system in an increasing number of cases, and discussion has been made on a distributed power storage system. It has been expected that a rechargeable battery mounted on an electric vehicle or the like is used as a battery device that is used in the distributed power storage system and can be charged and discharged. The state (such as the degradation state) of a rechargeable battery mounted on a typical battery system or an electric vehicle for public transport is constantly evaluated, but the state of a rechargeable battery mounted on an electric vehicle owned by an individual user is not often evaluated. As a result, it is difficult to determine an electrical power amount that can be charged and discharged when an electric vehicle owned by an individual user functions as a distributed power source device.

The state of a rechargeable battery on an electric vehicle can be evaluated by analyzing operational data of the rechargeable battery or analyzing measurement data obtained when the rechargeable battery is charged by a charger. Operational data of a rechargeable battery owned by an individual user is difficult to obtain in the context of personal information protection. However, measurement data acquired at charging by a charger can be used. In the present embodiment, the state of a rechargeable battery is evaluated by using measurement data acquired at charging by a charger.

Figure 1:
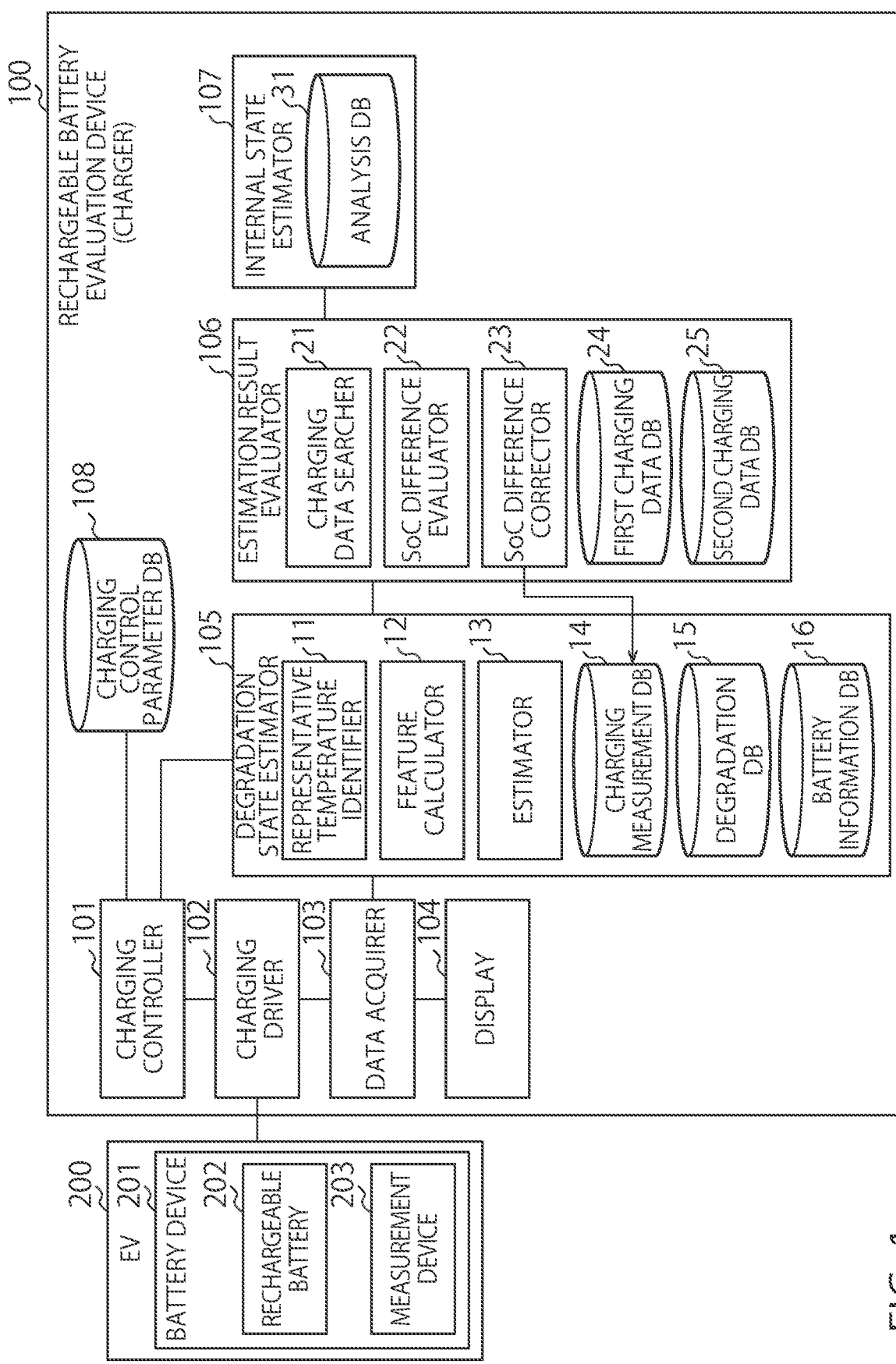
FIG. 1 is a block diagram of the entire configuration of a rechargeable battery evaluation system according to an embodiment of the present invention.

FIG. 1 is a block diagram of the entire configuration of a rechargeable battery evaluation system according to the embodiment of the present invention. The rechargeable battery evaluation system in FIG. 1 includes a rechargeable battery evaluation device 100 and an electric vehicle 200.

A battery device 201 is mounted on the electric vehicle (EV) 200. The battery device 201 includes a rechargeable battery 202, and a measurement device 203 configured to measure the voltage, current, temperature, and the like of the rechargeable battery. The rechargeable battery is also called secondary battery, but referred to as rechargeable battery in the following description. The rechargeable battery 202 may be one cell or may be an assembled battery in which a plurality of cells are connected in series, parallel, or series-parallel.

The EV 200 is a vehicle configured to operate by using electric energy accumulated in the rechargeable battery 202 as a power source. The EV 200 is an exemplary vehicle but may be any other vehicle that uses a rechargeable battery as a drive source, such as a plug-in hybrid electric vehicle (PHEV), an electric bus, an electric industrial vehicle, or a train. The rechargeable battery 202 of the EV 200 can be charged by a charger disposed in a charging station, a road shoulder, a car park, or the like. Electrical power accumulated in the rechargeable battery 202 can be electrically discharged (reverse power flow) to an electrical power system through a charger.

A scheme by which electrical power is transmitted from a charger to the rechargeable battery 202 may be any of a contact charging scheme and a non-contact charging scheme. In the contact charging scheme, for example, the charger and the EV are connected with each other through their connectors and a charging cable, and charging is performed by transmitting electric energy from the charger to the charging cable. In the non-contact charging scheme, for example, a coil provided on the charger side and a coil provided on the EV side are positioned opposite each other, and electric energy is transmitted through magnetic coupling between the coils.

The rechargeable battery evaluation device 100 evaluates, as the state of the rechargeable battery 202 mounted on the EV 200, the degradation state and internal state of the rechargeable battery 202. The rechargeable battery evaluation device 100 is provided at a charger. Measurement data obtained when the charger charges the rechargeable battery 202 is used to evaluate the degradation state and internal state of the rechargeable battery 202. Any state other than the degradation state and the internal state may be an evaluation target state of the rechargeable battery 202. The rechargeable battery evaluation device 100 has a function to charge the charger and a function to evaluation the rechargeable battery 202.

The rechargeable battery evaluation device 100 includes a charging controller 101, a charging driver 102, a data acquirer 103, a display 104, a degradation state estimator 105, an estimation result evaluator 106, an internal state estimator 107, and a charging control parameter database (DB) 108. The degradation state estimator 105 is an exemplary first state estimator according to the present embodiment. The internal state estimator 107 is an exemplary second state estimator according to the present embodiment.

The charging controller 101 starts charging of the rechargeable battery 202 once a predetermined charging start condition is satisfied. The charging controller 101 controls charging by, for example, outputting a charging command that specifies current, voltage, or power to the charging driver 102 at a constant time interval. An exemplary charging start condition is inputting of a charging instruction from a user of the EV 200 or an administrator of the charger. A specific example of the inputting of a charging instruction is press of a charging button provided to the charger. In a case of contact charging, when the charging cable is connected to the EV 200, the charging controller 101 may automatically sense the connection and determine that the charging start condition is satisfied. In a case of the non-contact charging scheme, when the EV 200 stops at a predetermined position, the charging controller 101 may sense the stop of the EV 200 and determine that the charging start condition is satisfied. The charging start condition may be defined by another method.

The charging driver 102 charges the rechargeable battery 202 of the EV 200 based on control by the charging controller 101. The charging is performed by using an external power source (for example, a commercial power source or a large-sized battery system) (not illustrated). In a case of the contact charging scheme, electric energy is supplied to the EV 200 through the charging cable connecting the EV 200 and the charger. In a case of the non-contact charging scheme, a transmission device configured to wirelessly transmit electrical power is provided to the charging driver 102. A coil of the transmission device and a coil of an electricity reception device provided at the EV 200 are positioned opposite each other. Electric energy is wirelessly transmitted from the transmission device through magnetic coupling between the coil of the transmission device and the coil of the electricity reception device.

The charging driver 102 performs charging by using various charging schemes such as constant current charging, impulse charging, and constant voltage charging. For example, first, the constant current charging is performed, and then switched to the constant voltage charging when the voltage of the rechargeable battery 202 has become equal to or higher than a threshold value. Constant power charging may be performed in place of the constant current charging. Halfway through the constant current charging, switching to the impulse charging is performed. The impulse charging is performed for a predetermined duration. The impulse charging is performed once or a plurality of times. The charging controller 101 monitors at least one of the voltage, current, temperature, and the like of the rechargeable battery 202 after charging start, and controls charging by the charging driver 102. The constant current charging or the constant power charging corresponds to, for example, charging with first current. The impulse charging corresponds to, for example, charging with second current.

The constant current charging or the constant power charging is charging performed at constant current or constant power, respectively. Examples of the constant current includes 1 C. The value 1 C is a current value for charging the rated capacitance of the rechargeable battery 202 in one hour. The value 1 C is exemplary, and the constant current may be another current value such as 0.8 C or 1.2 C. Hereinafter, a case in which the constant current charging is performed is assumed, but the constant power charging may be performed instead.

The impulse charging is charging performed by applying current in pulses. The current in pulses is, for example, square-wave current. However, the shape of current is not limited to a rectangle but may be another shape such as the shape of a trigonometric or triangular current. In the present embodiment, the current of the impulse charging is also referred to as impulse current. The impulse current may be generated by superimposing pulses of certain current on the current of the constant current charging. For example, current of, for example, 0.2 C or 0.3 C is superimposed on current of 1 C. Alternatively, the current may be generated by changing the current of the constant current charging to a larger value for a certain duration. For example, the current is switched from 1 C to 1.2 C or 1.3 C and returned to 1 C after a predetermined duration ends. The impulse charging is intermittently performed once or a plurality of times halfway through the constant current charging. The impulse charging is performed to acquire data of the rechargeable battery 202 for evaluation.

The constant voltage charging is charging performed at constant voltage. The constant voltage charging is performed when the voltage of the rechargeable battery 202 becomes equal to or higher than a threshold value through the constant current charging (and the intermittent impulse charging). Specifically, switching to the constant voltage charging is performed when the voltage of the rechargeable battery 202 becomes equal to or higher than a threshold value $\beta$. Through the constant voltage charging, current supplied to the rechargeable battery 202 gradually decreases while the voltage of the rechargeable battery 202 is maintained constant. The charging ends when the current supplied to the rechargeable battery 202 becomes smaller than a threshold value or zero.

The charging driver 102 may include a communication circuit configured to perform wired or wireless communication with the EV 200.

The charging controller 101 controls the charging driver 102 by using a charging control parameter DB 108. Charging control parameters are stored in the charging control parameter DB 108. Examples of the parameters include the current value of the constant current charging and the voltage value of the constant voltage charging. The examples also include the current value of the impulse charging, a timing at which the impulse charging is performed, the number of times that the impulse charging is performed, and a time length in which the impulse charging is performed once. In addition, the examples include a time interval in which the charging command is output to the charging driver 102. The timing at which the impulse charging is performed may be determined based on an elapsed time since charging start of the rechargeable battery

202 or an electrical power amount (electrical power increased amount) charged since the charging start or may be determined based on the voltage (charging voltage) of the rechargeable battery 202.

When outputting the charging command to the charging driver 102 at the constant time interval, the charging controller 101 outputs a flag (impulse flag) identifying whether to perform the impulse charging to the data acquirer 103 or the degradation state estimator 105.

The data acquirer 103 acquires battery information of the rechargeable battery 202 from the EV 200 before start charging of the rechargeable battery 202. The battery information of the rechargeable battery 202 is stored in a storage provided in the rechargeable battery 202 or the EV 200 in advance. This storage may be an optional device such as a memory, a hard disk, or an SSD. The data acquirer 103 transfers the acquired battery information to the degradation state estimator 105 and the display 104. The battery information may be acquired after the charging start.

The battery information of the rechargeable battery 202 includes, for example, information indicating the initial state of the rechargeable battery 202, and the kind (for example, the model number or the electrode kind) of the rechargeable battery. The information indicating the initial state includes the charging amount, voltage, temperature, positive electrode capacitance, negative electrode capacitance, internal resistance, and the like of the rechargeable battery. The charging amount is, for example, the state of charge (SoC). The SoC is the ratio of the amount of electrical power (electric charge) accumulated in the rechargeable battery 202 relative to the rated capacitance (in other words, a maximum charging amount before degradation). The SoC may be expressed in percentage. Another exemplary of the charging amount is the actual amount of electrical power accumulated in the rechargeable battery 202. The unit of the electrical power amount is, for example, kWh or Ah. the SoC included in the battery information of the rechargeable battery 202 corresponds to information indicating a charging amount (initial charging amount) before charging start. This SoC is referred to as an initial SoC.

The acquisition of the battery information may be performed through instruction to the data acquirer 103 by the charging controller 101 before charging start. Alternatively, the acquisition of the battery information may be automatically performed at the timing when the data acquirer 103 becomes able to acquire the battery information, for example, at the timing when communication with the EV 200 becomes possible.

The data acquirer 103 also acquires measurement data including measured values of the voltage, current, temperature, and the like of the rechargeable battery 202 in each constant sampling time while charging is performed after charging start. In addition, the data acquirer 103 receives the impulse flag from the charging controller 101. The data acquirer 103 includes a clock for measuring time. The data acquirer 103 transfers the acquired measurement data and the impulse flag to the degradation state estimator 105 and the display 104 in association with time.

The measurement data may include an item other than voltage, current, temperature, and the like, for example, the value of charging electrical power or humidity. The measurement data may not include some of voltage, current, temperature, and the like.

The data acquirer 103 may calculate the present charging amount (SoC) of the rechargeable battery 202 based on the initial SoC and the current value and may add the calculated SoC to the measurement data. The data acquirer 103 may calculate the amount of electrical power (electrical power increased amount) charged since charging start and may add the calculated electrical power increased amount to the measurement data. The SoC may be calculated based on the initial SoC and the electrical power increased amount. The following describes an example in which the SoC is calculated.

For example, when the rated capacitance is $X1$ [Ah], the initial SoC is $Y1$ [%], and the amount of electrical power charged in a time since charging start is $X2$ [Ah], the SoC is $[\{X1 \times (Y1/100) + X2\}/X1] \times 100$[%].

A method by which the data acquirer 103 acquires the battery information and the measurement data is optional. For example, when contact charging is performed, the charging driver 102 receives the battery information or the measurement data from the EV 200 through the charging cable connected with the EV 200, and transfers the received battery information or measurement data to the data acquirer 103. When non-contact charging is performed, a wireless communicator is provided at the charging driver 102 and acquires the battery information or the measurement data by performing communication with a wireless communicator (not illustrated) of the EV 200. Alternatively, a wireless communicator may be provided at the data acquirer 103 to acquire the battery information or measurement data of the rechargeable battery 202 through wireless communication with the EV 200.

Information other than the battery information and the measurement data may be acquired from the EV 200. For example, information of the car type or specifications of the EV 200 may be acquired.

Figure 2:
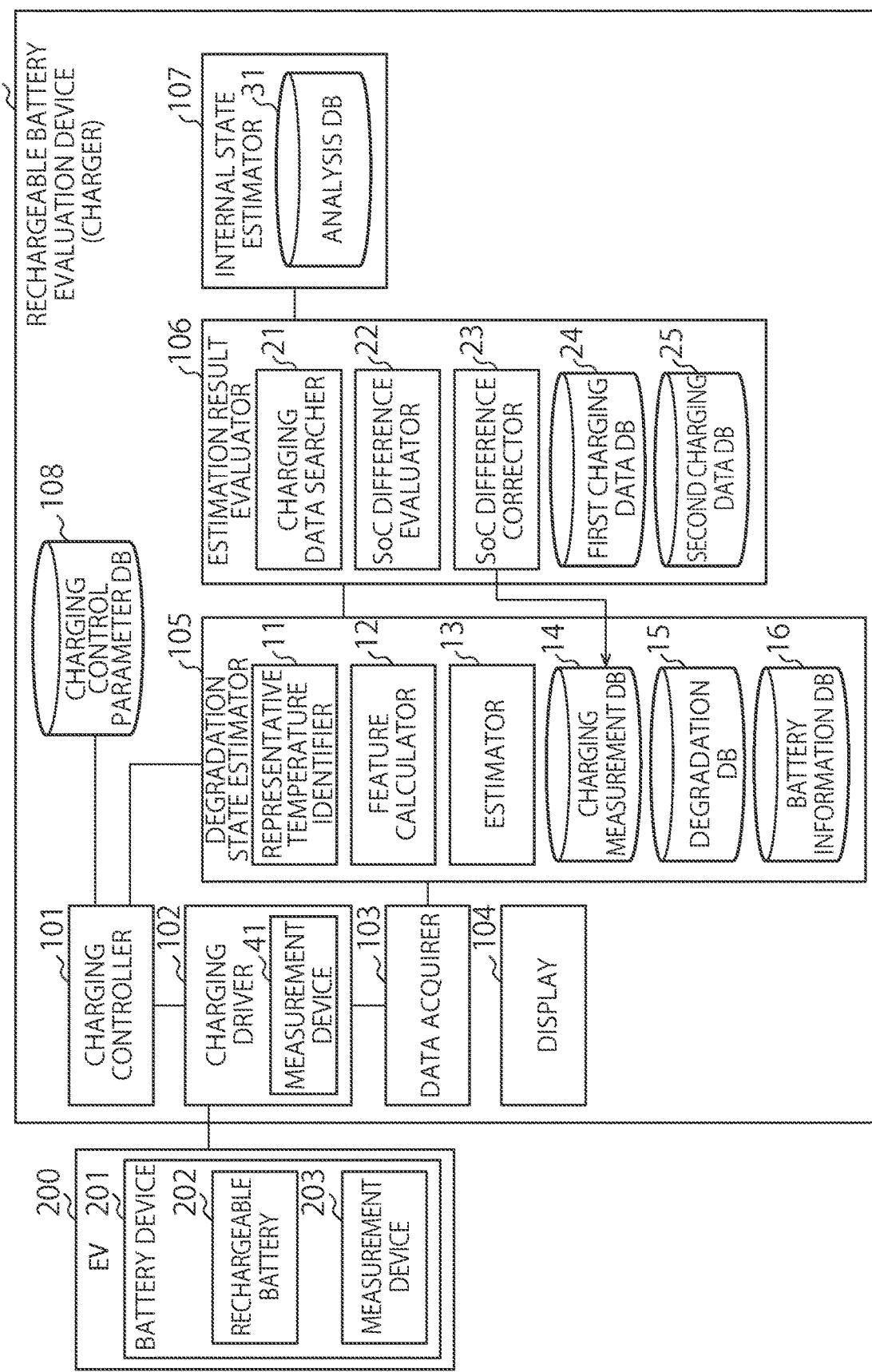
FIG. 2 is a block diagram of another exemplary entire configuration of the rechargeable battery evaluation system according to the embodiment of the present invention.

Measurement of the voltage, current, and the like of the rechargeable battery 202 may be performed by the charging driver 102, not by the rechargeable battery 202. FIG. 2 illustrates an exemplary configuration of the rechargeable battery evaluation system in this case. The charging driver 102 additionally includes a measurement device 41. The measurement device 41 measures the voltage, current, and the like of the rechargeable battery 202 being charged.

The display 104 is a display device configured to display information or data on a screen and is, for example, a liquid crystal display device or an organic EL display device. The display 104 displays, for example, information indicating, in real time, a charging status after start of charging of the rechargeable battery 202 on the screen. Examples of such information include the SoC and the remaining time until charging completion. The remaining time may be approximately calculated based on the remaining charging amount until full charge (rated capacitance) while assuming that the remaining charging is performed at a constant current value (for example, 1 C). Alternatively, a table in which the remaining charging amount and the remaining time are associated with each other may be used. Alternatively, when information of the degradation state (state of health (SoH)) of the rechargeable battery 202 may be used when included in the battery information. For example, when the degradation state is defined by the present capacitance or rated capacitance of the rechargeable battery 202, a value obtained by multiplying the rated capacitance by the value of the degradation state is regarded as the capacitance of the rechargeable battery 202. The remaining time is calculated based on the remaining charging amount up to this capacitance. As described later, the accuracy of the SoC (the initial SoC) indicated by the battery information acquired from the rechargeable battery 202 is low in some cases, and thus the SoC and the remaining time thus displayed are merely guides.

The degradation state estimator 105 includes a representative temperature identifier 11, a feature calculator 12, an estimator 13, a charging measurement DB 14, a degradation DB 15, and a battery information DB 16.

The degradation state estimator 105 receives the battery information from the data acquirer 103 and stores the received battery information in the battery information DB 16. In addition, the degradation state estimator 105 receives the measurement data and the impulse flag associated with time from the data acquirer 103 and stores the received measurement data and impulse flag in the charging measurement DB 14.

FIG. 3 illustrates exemplary data of the charging measurement DB 14. The charging amount (SoC), the voltage, the current, the temperature, and the impulse flag are stored for each constant time. As the value of the impulse flag, "0" indicates that the impulse charging has not been performed, and "1" indicates that the impulse charging has been performed. One execution of the impulse charging is continuously performed in a duration, and thus the impulse flag continuously indicates "1" at a time included in the duration of one execution of the impulse charging. In the table, t1 corresponds to a charging start time, and to corresponds to a charging end time. For example, the SoC, the voltage, the current, and the temperature are stored on the row of time t1 as a charging result at time t1, and the impulse charging has not been performed at this time.

The degradation state estimator 105 may directly receive the impulse flag from the charging controller 101. In this case, the degradation state estimator 105 may store the impulse flag in the charging measurement DB 14 in association with the measurement data received from the data acquirer 103.

Alternatively, whether the impulse charging has been performed may be determined without using the impulse flag. For example, it is determined that the impulse charging has been performed when the current value is equal to or larger than a current value for the impulse charging.

When having received a charging completion notification from the charging controller 101, the degradation state estimator 105 starts evaluation processing. The evaluation processing is performed by the degradation state estimator 105, the estimation result evaluator 106, and the internal state estimator 107.

The representative temperature identifier 11 determines a representative temperature of the rechargeable battery 202 in a charging duration based on temperature data in the charging measurement DB 14. The representative temperature is, for example, an average temperature, a minimum temperature, a maximum temperature, or a mean temperature. The representative temperature may be temperature at charging start or temperature at charging end. The average temperature is assumed in this example. In the example illustrated in FIG. 3, the average temperature over time t1 to time to corresponds to the representative temperature.

The feature calculator 12 calculates, by using the measurement data of the rechargeable battery 202 at the impulse charging, a feature of change in at least one of the voltage and charging amount of the rechargeable battery 202 due to switching from the constant current charging to the impulse charging. In this example, two features are calculated. The first feature expresses the ratio of a voltage increased amount $\Delta V$ relative to an increased amount $\Delta SoC$ of the SoC in a duration including an impulse charging duration, and the ratio is referred to as a gradient $\Delta V/\Delta SoC$. The second feature expresses a voltage increased by superimposing the impulse current, and the voltage is referred to as a boost voltage Vsp. Although the two features are calculated in this example, only one of the features may be calculated.

Exemplary calculation of the gradient $\Delta V/\Delta SoC$ and the boost voltage Vsp will be described with reference to FIG. 4.

Figure 4:
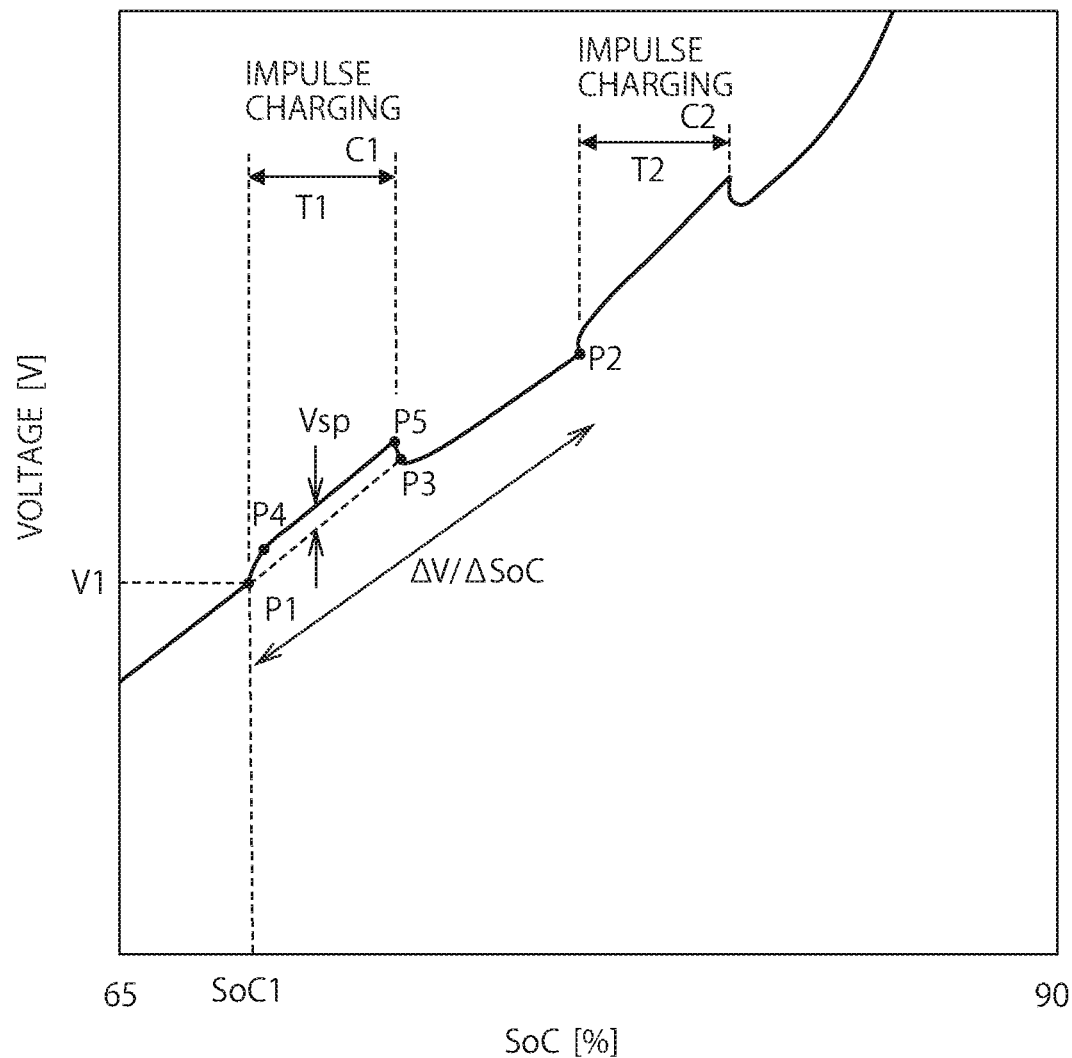
FIG. 4 is a diagram illustrating exemplary calculation of a gradient $\Delta V/\Delta SoC$ and a boost voltage Vsp.

FIG. 4 illustrates part of a charging curve produced based on the measurement data (refer to FIG. 3) acquired while the rechargeable battery 202 of the EV 200 is charged. The SoC at start of the charging curve is the SoC before charging start and is the initial SoC specified from the battery information. The SoC at 100% corresponds to the rated capacitance. A point expressed by a pair of the initial SoC and the voltage is first plotted as a starting point of the charging curve, and then a point expressed by a pair of the SoC and the voltage is plotted based on the measurement data in each constant time.

In the example illustrated in FIG. 4, the constant current charging is first performed after charging start. The current value of the constant current charging is, for example, 1 C. Thereafter, the impulse charging is performed twice at an interval. Specifically, the first impulse charging C1 is performed in Duration T1, and the second impulse charging C2 is performed in Duration T2. Duration T1 and Duration T2 have equal lengths. The number of times of the impulse charging may be one or may be three or more. The length of each impulse charging may be equal or different. The current value of the impulse charging is different from a constant current value and is, for example, 1.2 C or 1.3 C, which is larger than the constant current value. However, the current value may be smaller than the constant current value, for example, 0.8 C. Duration T1 and Duration T2 corresponds to a first duration in which charging is performed at the second current.

The gradient $\Delta V/\Delta SoC$ for the impulse charging C1 is calculated as described below. For example, the SoC and the voltage at a point P1 right before start of the impulse charging C1 are represented by (SoC1, V1), and the SoC and the voltage at a point P2 right before start of the impulse charging C2 are represented by (SoC2, V2). In this case, $\Delta V/\Delta SoC$ is calculated by Expression (1) below.

$$\Delta V/\Delta SoC=(V2-V1)/(SoC2-SoC1) \qquad (1)$$

The value $\Delta V$ corresponds to an exemplary voltage change amount due to switching of charging current from the first current to the second current. For example, $\Delta SoC$ corresponds to a charging-amount change amount that is the difference between the charging amount of the rechargeable battery 202 before charging is performed at the second current (in other words, before supply of the second current) and the charging amount of the rechargeable battery 202 after charging is performed at the second current (in other words, after supply of the second current). The gradient $\Delta V/\Delta SoC$ corresponds to the ratio of the voltage change amount and the charging-amount change amount.

In this manner, the gradient $\Delta V/\Delta SoC$ is calculated in a duration including Duration T1 of the impulse charging C1. The charging amount and the voltage at an optional timing between a time right after end of the impulse charging C1 and a time right before start of the impulse charging C2 may be used as (SoC2, V2). When the second impulse charging is not performed, the charging amount and the voltage at an optional timing after end of the first impulse charging may be used as (SoC2, V2).

The boost voltage Vsp is calculated as described below. The average value of a voltage V1 at the point P1 right before start of the impulse charging C1 and a voltage V3 at a point P3 after end of the impulse charging C1 is represented by Vave2. In other words, Vave2 is defined as Vave2=(V1+V3)/2. The point P3 is, for example, a point two seconds after end of the impulse charging C1. The average value Vave2 corresponds to, for example, the average value of voltages before and after Duration T1. The average value Vave2 corresponds to a second voltage in Duration T1 when it is assumed that charging is performed at constant current (the first current) for Duration T1.

The average value of a voltage V4 at a point P4 a constant time after start of the impulse charging C1 and a voltage V5 at a point P5 right before end of the impulse charging C1 is represented by Vave1. In other words, Vave1 is defined as Vave1=(V4+V5)/2. The voltage at the point P4 is a voltage after impulse rising is completed. The voltage at a point a constant time (for example, 40 seconds) after start of the impulse charging C1 is used to avoid use of the voltage halfway through rising. The average value Vave1 corresponds to, for example, a first voltage in a duration in which the impulse charging C1 is performed.

In this case, the boost voltage Vsp is calculated by Expression (2) below. This corresponds to the difference between the first voltage and the second voltage.

$$\text{Boost voltage } Vsp=Vave1-Vave2 \quad (2)$$

The estimator 13 estimates the degradation state of the rechargeable battery 202 based on at least one of the two features (the gradient $\Delta V/\Delta SoC$ and the boost voltage Vsp) calculated by the feature calculator 12, and the degradation DB 15. The degradation state indicates how much the rechargeable battery 202 has degraded from a state before use start or at an optionally determined timing. For example, the degradation state is indicated by how much the capacitance of the rechargeable battery 202 has decreased from the rated capacitance. As an example, the degradation state can be defined by the present capacitance or rated capacitance of the rechargeable battery 202. As another example, the degradation state may be expressed by how much the internal resistance of the rechargeable battery 202 has increased from a state before use start. Examples of degradation of the rechargeable battery include electrode degradation and collapse of cell balance in a case of an assembled battery. For example, when the rechargeable battery is a lithium ion battery, the molecule structure of carbon contained in negative electrode material changes and the amount of lithium ion contained in carbon decreases in some cases. Examples of collapse of cell balance include charging amount or discharging amount difference between cells. For example, when full charge is determined for at least one cell, the assembled battery is determined as full charge irrespective of whether the other cells are fully charged.

The degradation DB 15 stores, for each pair of the representative temperature and the initial SoC, a table in which $\Delta V/\Delta SoC$, Vsp, and the degradation state (SoH) are associated with one another.

FIG. 5 illustrates an exemplary degradation DB 15. In this example, the table for a case in which the representative temperature is 25° C. and the initial SoC is SoCx is illustrated. The table is stored in the same format for any other pair of the representative temperature and the initial SoC.

The estimator 13 specifies, in the degradation DB 15, the table corresponding to a pair of the representative temperature identified by the representative temperature identifier 11 and the initial SoC indicated by the battery information. In the specified table, the SoH is specified based on corresponding $\Delta V/\Delta SoC$ and Vsp calculated by the feature calculator 12. The estimator 13 determines the specified SoH as the degradation state of the rechargeable battery 202.

When there is no table of a temperature equal to the identified representative temperature, the SoH may be calculated by interpolation processing. For example, the table of a temperature (referred to as Temp1) lower than the identified representative temperature, and the table of a temperature (referred to as Tempt) higher than the identified representative temperature are specified. The SoH is specified in each table similarly to the above-described method. The specified SoHs are referred to as SoH1 and SoH2, respectively. An interpolated SoH is calculated based on the difference $\Delta SoH$ between SoH2 and SoH1 and the difference $\Delta Temp$ between the identified representative temperature and Temp1. An exemplary formula that calculates the SoH by interpolation is indicated as Expression (3) below.

$$\text{Interpolated } SoH=SoH1+\Delta SoH(\Delta Temp/Temp2-Temp1) \quad (3)$$

Similarly to the case of the representative temperature, the SoH may be calculated by interpolation when there is no table of an initial SoC equal to the initial SoC indicated by the battery information. The two interpolations may be combined when there are no temperature equal to the identified representative temperature and no initial SoC equal to the initial SoC indicated by the battery information.

When one feature is calculated, a table in which the one feature and the SoH are associated with each other may be prepared for each pair of the representative temperature and the initial SoC.

The estimation result evaluator 106 includes a charging data searcher 21, a SoC difference evaluator 22, a SoC difference corrector 23, a first charging data DB 24, and a second charging data DB 25.

The first charging data DB 24 stores, for each pair of the battery temperature and the degradation state (the SoH), charging data (SoC difference evaluation charging data) obtained when the rechargeable battery is charged at constant current in a predetermined SoC range. The current value of the constant current charging is same as the current value of the constant current charging of the rechargeable battery 202. The SoC range is, for example, a wide range of 0 to 100[%] or 10 to 90[%]. This SoC range is wider than a SoC range assumed when the rechargeable battery 202 of the EV 200 is actually charged.

The charging data (SoC difference evaluation charging data) in the first charging data DB 24 corresponds to first charging data indicating the relation between the charging amount and the voltage. Thus, the first charging data DB 24 stores pieces of the first charging data corresponding to a plurality of respective degradation states. Alternatively, the first charging data DB 24 stores pieces of the first charging data corresponding to a plurality of respective pairs of the degradation state and the battery temperature.

FIG. 6 illustrates an exemplary first charging data DB 24. Specifically, FIG. 6 illustrates exemplary charging data obtained when the rechargeable battery, the battery temperature of which is 25° C. and the SoH of which is SoHx is charged at the constant current of 1 C. Similarly, charging data when the constant current charging is performed at 1 C is stored for any other pair of the temperature and the SoH. A constant current-constant voltage scheme in which switching to the constant voltage charging is performed after the constant current charging at 1 C may be used.

The charging data in FIG. 6 is data including a pair of the voltage V and the SoC for each sampling time in a charging duration, in other words, data indicating voltage change in accordance with the SoC (charging amount). However, the charging data may be in another format, for example, may be data including, for each sampling time, a pair of the voltage and the sampling time, in other words, data indicating voltage change in accordance with time. In this case as well, the charging data can be obtained in a format same as that of FIG. 6 by integrating the current value of the constant current charging with respect to time.

The second charging data DB 25 stores, for each pair of the battery temperature and the degradation state, charging data (internal state evaluation charging data) obtained when the rechargeable battery is charged at constant current in the predetermined SoC range. The current value of the constant current charging is a current value suitable for internal state estimation to be described later and different from the current value of the constant current charging of the rechargeable battery 202. Specifically, the current value at acquisition of charging data (internal state evaluation charging data) is different from the current value at acquisition of charging data in the first charging data DB 24.

FIG. 7 illustrates an exemplary second charging data DB 25. Specifically, FIG. 7 illustrates charging data obtained when the rechargeable battery, the battery temperature of which is 25° C. and the SoH of which is SoHx is charged at the constant current of 0.2 C. Similarly, charging data when the constant current charging is performed at 0.2 C is stored for any other pair of the battery temperature and the SoH. A constant current-constant voltage scheme in which switching to the constant voltage charging is performed after the constant current charging at 0.2 C may be used. The value 0.2 C is exemplary and may be another value such as 0.1 C or 0.3 C.

The charging data searcher 21 specifies, in the first charging data DB 24, charging data (SoC difference evaluation charging data) corresponding to a pair of the degradation state (the SoH) obtained by the estimator 13 and the representative temperature identified by the representative temperature identifier 11. When there is no data of a battery temperature equal to the representative temperature nor data of a SoH equal to the SoH obtained by the estimator 13, interpolation processing may be performed as described above. For example, interpolated charging data may be generated by synthesizing charging data of battery temperatures higher and lower than the representative temperature through interpolation processing. Alternatively, interpolated charging data may be generated by synthesizing charging data of SoHs higher and lower than the estimated SoH through interpolation processing.

The SoC difference evaluator 22 specifies, as an evaluation target voltage, the voltage of the charging measurement DB 14 at an optional time. For example, the evaluation target voltage is the voltage at a time right before start of the impulse charging or the voltage at time t1 at which charging is first started. As an example, the evaluation target voltage is the voltage at the point P1 in FIG. 4 (V1 in FIG. 4). As a modification, the evaluation target voltage may be the voltage before charging start, which is indicated by the battery information of the rechargeable battery 202.

In addition, the SoC difference evaluator 22 specifies, as a reference SoC, the SoC corresponding to the evaluation target voltage in the above-described specified charging data (SoC difference evaluation charging data). This will be specifically described below with reference to FIG. 8.

Figure 8:
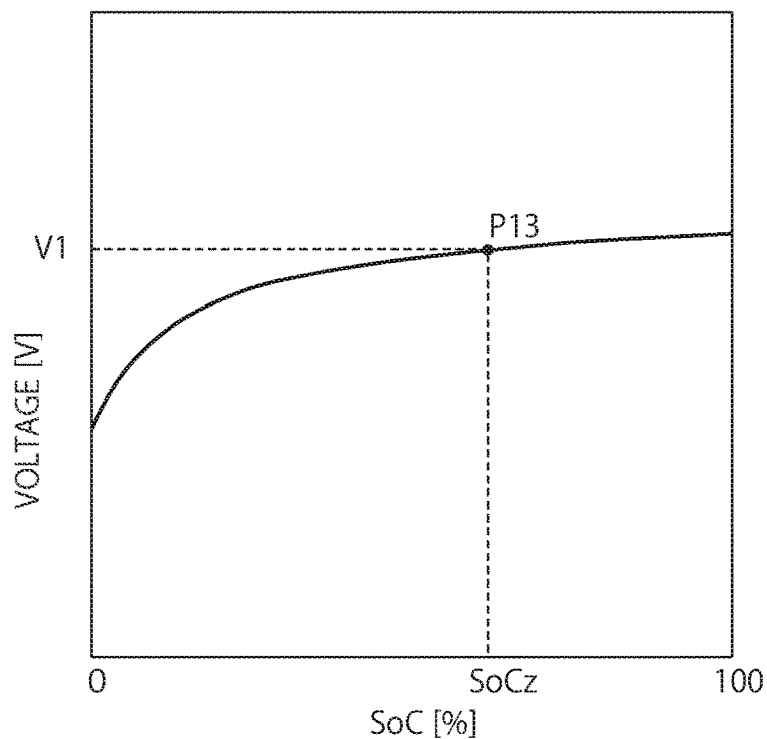
FIG. 8 is a diagram schematically illustrating an example in which specified charging data is displayed in a graph.

FIG. 8 schematically illustrates an example in which the above-described specified charging data (SoC difference evaluation charging data) is displayed in a graph. The horizontal axis represents the SoC, and the vertical axis represents the voltage. In the graph, a point P13 corresponding to the evaluation target voltage (V1 in FIG. 8) is specified, and the SoC corresponding to the point P13 is specified as the reference SoC (SoCz in FIG. 8).

In addition, the SoC difference evaluator 22 specifies, as an evaluation target SoC, the SoC corresponding to the evaluation target voltage in the measurement data of the rechargeable battery 202 in the charging measurement DB 14. When the evaluation target voltage is the voltage V1 at the point P1 in FIG. 4, SoC1 at the point P1 is specified as the evaluation target SoC (SoCy in FIG. 4).

The SoC difference evaluator 22 determines whether the absolute value of the difference between the reference SoC and the evaluation target SoC is smaller than an offset d (threshold value)

When the absolute value is smaller than the offset d, it is determined that the initial SoC acquired from the rechargeable battery 202 and the SoH estimated by the estimator 13 are correct or highly accurate. Being correct means that the initial SoC and the estimated value of the SoH have small differences from their true values of the rechargeable battery 202.

When the absolute value of the difference is equal to or larger than the offset d, it is determined that the initial SoC acquired from the rechargeable battery 202 and the SoH estimated by the estimator 13 are incorrect or fairly accurate. Being incorrect means that the initial SoC and the estimated value of the SoH have large differences from their true values of the rechargeable battery 202.

When it is determined that the above-described difference absolute value is equal to or larger than the offset d, the SoC difference corrector 23 corrects, with the offset d in a direction in which the evaluation target SoC becomes closer to the reference SoC, the SoC at each time in the measurement data in the charging measurement DB 14 and the initial SoC indicated by the battery information.

Specifically, when the evaluation target SoC is higher than the reference SoC, the offset d is subtracted from the initial SoC and the SoC at each time. In the example of FIG. 3, the offset d is subtracted from the SoC at each time after charging start time t1 and the initial SoC.

When the evaluation target SoC is lower than the reference SoC, the offset d is added to the initial SoC and the SoC at each time. In the example of FIG. 3, the offset d is added to the SoC at each time after charging start time t1 and the initial SoC.

Consider a specific example in which the evaluation target SoC is 50, the reference SoC is 60, and the offset is 5. In this case, the absolute value of the difference between the evaluation target SoC and the reference SoC is 10, which is equal to or larger than the offset. The evaluation target SoC is lower than the reference SoC. Thus, in this case, the offset 5 is added to the initial SoC and the SoC at or after t1.

The degradation state estimator 105 estimates the degradation state (SoH) of the rechargeable battery 202 again by using the corrected initial SoC, the degradation DB 15, and each calculated feature.

The charging data searcher 21 and the SoC difference evaluator 22 of the estimation result evaluator 106 perform specification of charging data in the first charging data DB 24 and specification of the SoC (reference SoC) by performing processing as described above based on the degradation state estimated again. In addition, an evaluation reference SoC is specified in the corrected measurement data (corrected SoC) in the charging measurement DB 14. It is determined whether the absolute value of the difference between the reference SoC and the evaluation target SoC is smaller than the offset d. When the difference absolute value is smaller than the offset d, the SoC at each time in the charging data is corrected by the SoC difference corrector 23 again. In addition, the initial SoC is corrected. Then, the same processing is recursively repeated until it is determined by the SoC difference evaluator 22 that the absolute value of the difference between the reference SoC and the evaluation target SoC is smaller than the offset d.

When it is determined by the SoC difference evaluator 22 that the above-described difference absolute value is smaller than the offset d, it is determined that the SoH at this time (the SoH calculated by the estimator 13 right before) highly accurately indicates the degradation state of the rechargeable battery 202.

The charging data searcher 21 specifies, in the second charging data DB 25, charging data (internal state evaluation charging data) corresponding to the pair of the SoH and the above-described representative temperature. When there is no data of a battery temperature equal to the representative temperature nor data of a SoH equal to the SoH, interpolation processing may be performed as described above. For example, interpolated charging data may be generated by synthesizing charging data of battery temperatures higher and lower than the representative temperature through interpolation processing. Alternatively, interpolated charging data may be generated by synthesizing charging data of SoHs higher and lower than the estimated SoH through interpolation processing.

The estimation result evaluator 106 transfers the charging data (internal state evaluation charging data) specified by the charging data searcher 21 to the internal state estimator 107. The charging data can be handled as charging data obtained when the rechargeable battery 202 is actually charged at the constant current of, for example, 0.2 C. In addition, the estimation result evaluator 106 transfers the SoH calculated by the estimator 13 right before (calculated last) and the battery information acquired from the rechargeable battery 202 to the internal state estimator 107.

The internal state estimator 107 estimates the internal state of the rechargeable battery 202 by charging curve analysis (CCA) based on the charging data (internal state evaluation charging data) and the battery information of the rechargeable battery 202, which are received from the estimation result evaluator 106. The internal state estimator 107 specifies the initial state of each of the electrodes, internal resistance, and the like of the rechargeable battery 202 in the battery information of the rechargeable battery 202, and estimates the internal state of the rechargeable battery 202 by charging curve analysis. Examples of the internal state of the rechargeable battery 202 include the positive electrode capacitance, negative electrode capacitance, internal resistance, and negative electrode potential difference of the rechargeable battery 202. A typically known method can be used for charging curve analysis. These methods are described in detail in, for example, Japanese Patent Laid-Open No. 2012-251806, Japanese Patent Laid-Open No. 2014-190763, and Japanese Patent Laid-Open No. 2017-54696. Hereinafter, simple description will be made on an example in which the internal state is estimated. The method of estimating the internal state is merely exemplary and may be any other method.

The internal state estimator 107 includes an analysis DB 31. The analysis DB 31 stores functions or look-up tables for estimating various internal states.

[Exemplary Estimation of Positive Electrode Capacitance, Negative Electrode Capacitance, and Internal Resistance]

The analysis DB 31 stores a regression function for regression of voltage in charging data (internal state evaluation charging data) with a plurality of variables including the positive electrode capacitance, the negative electrode capacitance, and the internal resistance as unknown variables. The regression function is expressed as $V=f(Z1, Z2, \ldots, Zn)$. The variables $Z1$ to $Zn$ are unknown variables and correspond to, for example, the positive electrode capacitance, the negative electrode capacitance, and the internal resistance. An equation of the residual sum of squares, $S=(V-f(Z1, Z2, \ldots, Zn))^2$, is derived from the regression function. The variables $Z1, Z2, \ldots, Zn$ are calculated by solving simultaneous equations $\delta S/\delta Z1=0$, $\delta S/\delta Z2=0, \ldots, \delta S/\delta Zn=0$. The initial values of $Z1, Z2, \ldots, Zn$ are included in the battery information and used to solve the simultaneous equations.

[Exemplary Estimation of Negative Electrode Potential Difference]

The present battery capacitance (denoted by Q) of the rechargeable battery 202 is specified. This battery capacitance may be calculated by, for example, multiplying the SoH estimated by the estimator 13 right before by the rated capacitance of the rechargeable battery 202. A decreased amount of the battery capacitance is calculated by subtracting the specified battery capacitance from the initial battery capacitance (denoted by Q0) of the negative electrode of the rechargeable battery 202. The value of the initial battery capacitance of the negative electrode is included in the battery information acquired from the rechargeable battery 202. A charging depth Xcharge of the negative electrode of the rechargeable battery 202 being fully charged is calculated by $(Q0-\Delta Q)/Q0$. An open-circuit potential curve of the negative electrode is stored in the analysis DB 31 as a function $f(X)$ that returns an open-circuit potential (E) corresponding to a charging depth X. The charging depth Xcharge is substituted as the input variable of the function $f(X)$ to calculate a charging end potential (Eanode) of the negative electrode. In addition, one is substituted as the input variable to calculate an initial potential (Eanod_0) of the negative electrode. The initial potential of the negative electrode may be included in the battery information. Eanod_0 is subtracted from Eanode. A value obtained through the subtraction is obtained as the negative electrode potential difference.

Figure 9:
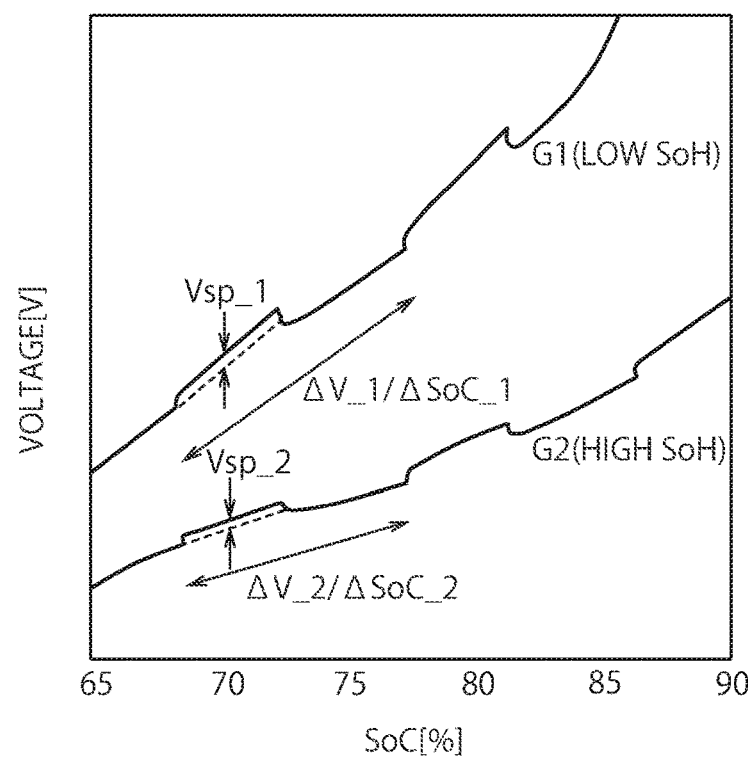
FIG. 9 is a diagram illustrating exemplary charging curves of a plurality of degraded storage batteries.

FIG. 9 illustrates, for a plurality of degraded storage batteries, exemplary charging curves generated from, for example, the measurement data acquired by the data acquirer 103. Two graphs G1 and G2 are illustrated. The graph G1 is same as that in FIG. 4. The graph G2 is a graph for a rechargeable battery less degraded than that of the graph G1. The boost voltage Vsp_1 of the impulse charging in the graph G1 is higher than the boost voltage Vsp_2 of the impulse charging in the graph G2. In addition, the gradient $\Delta V\_1/\Delta SoC\_1$ of the impulse charging in the graph G1 is larger than the gradient $\Delta V\_1/\Delta SoC\_2$ of the impulse charging in the graph G2. In this manner, as degradation proceeds, the boost voltage of the impulse charging increases, and the gradient increases as well. These tendencies can be used to highly accurately specify the degradation state and SoC of the rechargeable battery 202.

The display 104 displays an evaluation result of the rechargeable battery 202 on the screen. The evaluation result is, for example, information indicating the degradation state (SoH) of the rechargeable battery 202 and the internal state of the rechargeable battery 202. In addition, the evaluation result includes information of the remaining time until the lifetime of the rechargeable battery 202. For example, one of three pieces of information, namely, "lifetime is reached", "lifetime is not reached but maintenance is necessary", and "lifetime is not reached and maintenance is unnecessary" is specified in accordance with the value of the SoH. As another exemplary, a function or a table by which the SoH and the value (for example, the number of months) of the remaining time until the lifetime are associated with each other is prepared. The value of the remaining time may be specified based on the function or the table and the SoH obtained as the evaluation result.

Figure 10:
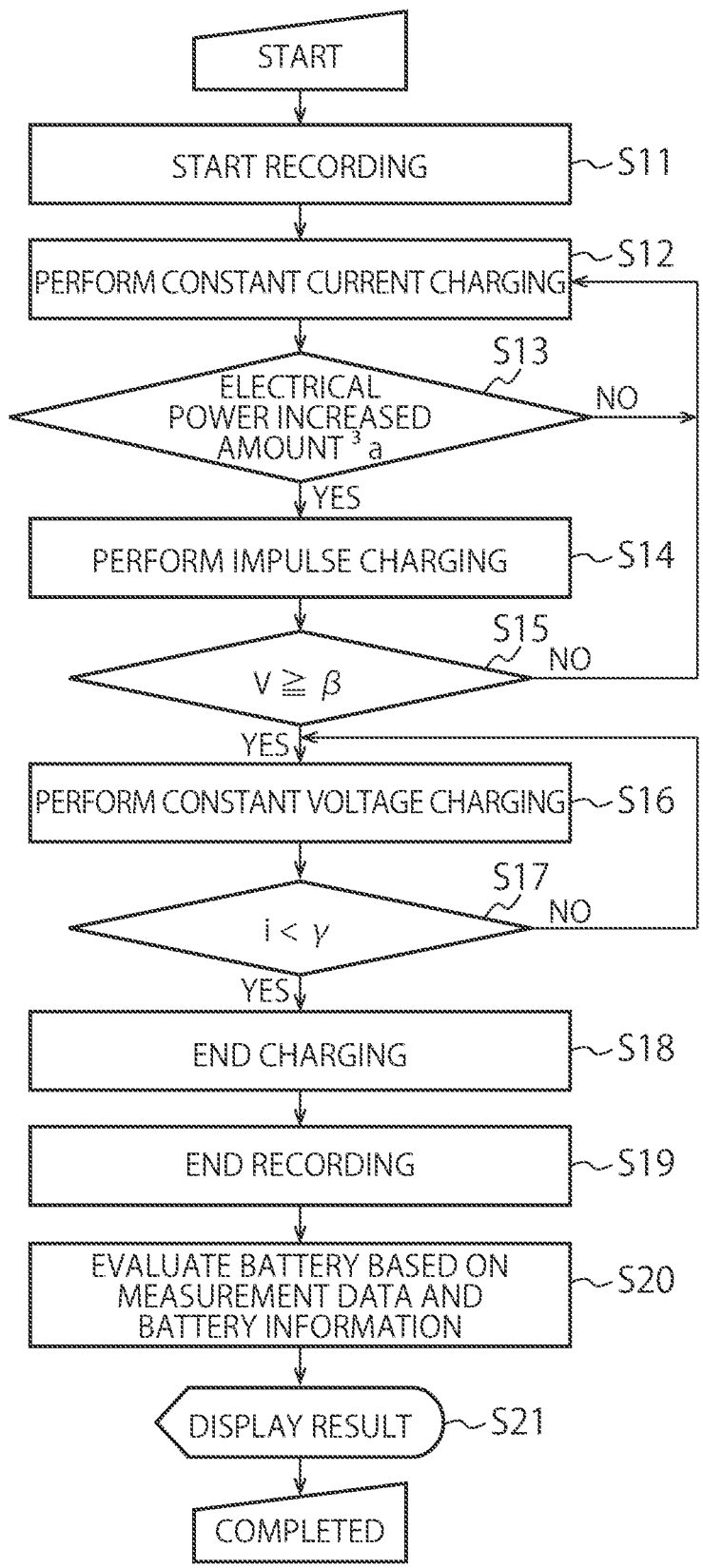
FIG. 10 is a flowchart of the entire operation of a rechargeable battery evaluation device according to the embodiment of the present invention.

FIG. 10 is a flowchart of the entire operation of the rechargeable battery evaluation device according to the present embodiment.

The charging controller 101 determines charging start when the charging start condition is satisfied. The charging controller 101 outputs a signal or data instructing acquisition of the battery information of the rechargeable battery 202 to the data acquirer 103 (S11). The charging controller 101 outputs a signal or data instructing acquisition of the measurement data to the data acquirer 103 and also outputs a signal or data instructing storage of the measurement data to the degradation state estimator 105 so that recording (logging) of the measurement data after charging start is performed (S11). The data acquirer 103 acquires the battery information and stores the acquired battery information in the battery information DB 16 of the degradation state estimator 105.

The charging controller 101 starts the constant current charging of the rechargeable battery 202 of the EV 200 by using the charging driver 102 (S12). For example, the constant current charging is performed at 1 C. The data acquirer 103 acquires the measurement data in each constant sampling time and acquires the impulse flag from the charging controller 101. These pieces of acquired data are stored in the charging measurement DB 14 in association with time.

The charging controller 101 calculates a charging amount (electrical power increased amount) since charging start. The electrical power increased amount may be calculated by using the charging measurement DB 14 or may be calculated from a current value instructed to the charging driver 102 and the elapsed time since charging start. It is determined whether the electrical power increased amount is equal to or larger than a threshold value $\alpha_x$ (in this example, x=1) (S13). The index x is incremented each time the present step is repeated. The threshold value $\alpha_x$ satisfies $\alpha_{x+1} > \alpha_x$. When the electrical power increased amount is smaller than the threshold value $\alpha_x$ (NO), the constant current charging is continued (S12). When the electrical power increased amount is equal to or larger than the threshold value $\alpha_x$ (YES), the impulse charging is performed for a predetermined duration (S14).

The charging controller 101 determines whether measurement voltage (charging voltage) of the rechargeable battery 202 has become equal to or higher than a threshold value $\beta$ (S15). When the measurement voltage is lower than the threshold value $\beta$, the constant current charging is continuously performed (S12). When the measurement voltage is equal to or higher than the threshold value $\beta$, switching to the constant voltage charging is performed (S16).

After start of the constant voltage charging, it is determined whether measurement current (charging current) of the rechargeable battery 202 has become smaller than a threshold value $\downarrow$ (S17). When the measurement current is equal to or larger than the threshold value $\gamma$, the constant voltage charging is continuously performed (S16). When the measurement current has become smaller than the threshold value $\gamma$, the charging controller 101 ends charging (S18). The charging controller 101 outputs a signal or data that instructs end of acquisition of the measurement data to the data acquirer 103 (S19). The charging controller 101 outputs a signal or data that instructs end of storage of the measurement data to the degradation state estimator 105 (S19).

The degradation state estimator 105, the estimation result evaluator 106, and the internal state estimator 107 perform the evaluation processing on the rechargeable battery 202 (estimation of the degradation state, evaluation of a result of the estimation, and estimation of the internal state) based on the measurement data in the charging measurement DB 14 and the battery information of the rechargeable battery 202 (S20). The display 104 displays a final estimation result of the degradation state, an estimation result of the internal state, and the like (S21). The display 104 may display information indicating the progress of charging while the processing at steps S12 to S18 is performed.

Figure 11:
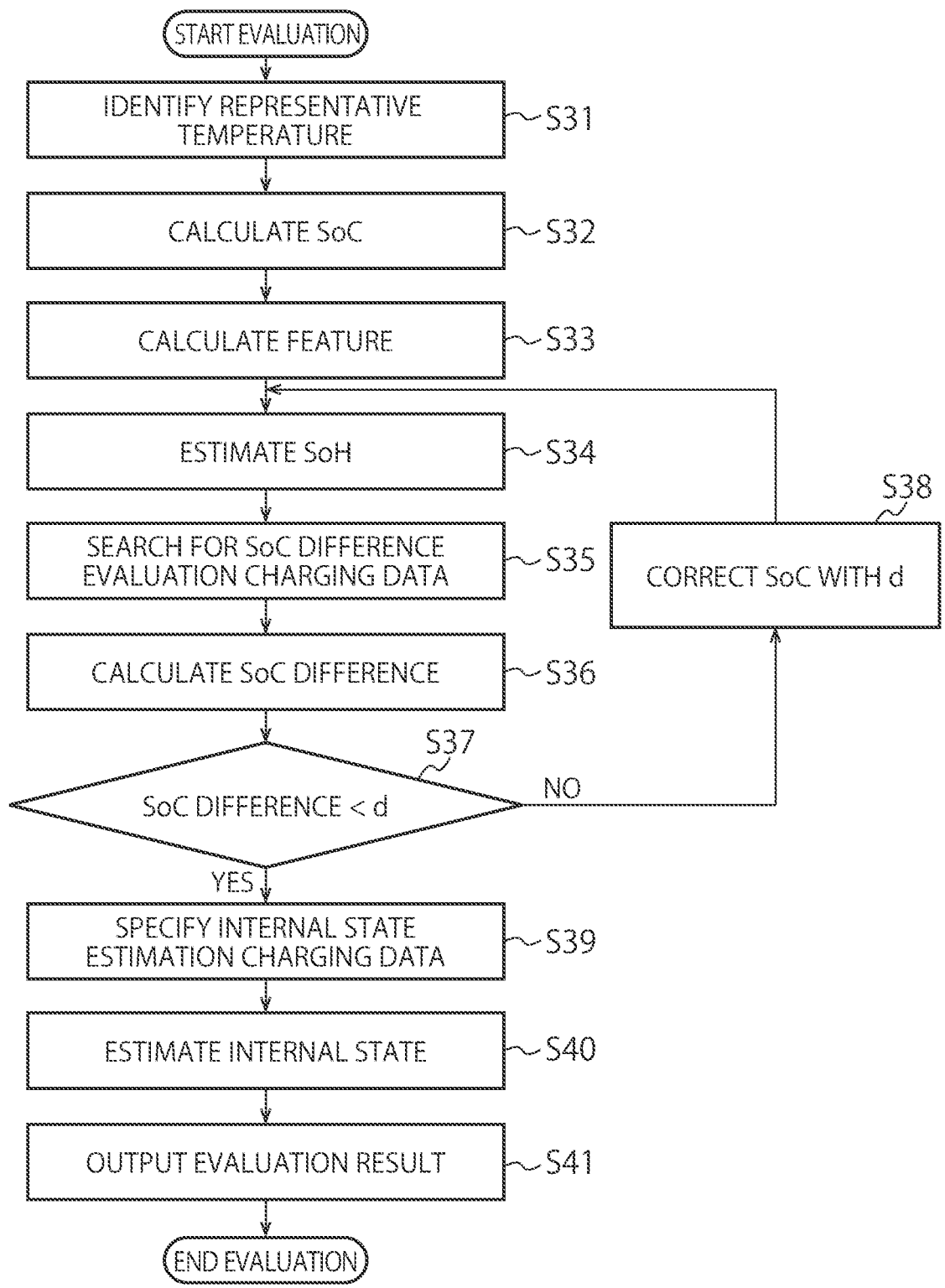
FIG. 11 is a flowchart of evaluation processing.

FIG. 11 is a detailed flowchart of the evaluation processing performed at step S20 in FIG. 10. The representative temperature identifier 11 specifies the representative temperature based on temperature data stored in the charging measurement DB 14. For example, a temperature average value from start to end of charging is specified as the representative temperature (S31).

The feature calculator 12 calculates the SoC at each time based on the initial SoC included in the battery information and the current value at each time in the measurement data (S32). Specifically, an electrical power amount increased from the initial SoC due to charging until each time is calculated, and an SoC increased value in accordance with the increased electrical power amount is added to the initial SoC, thereby calculating the SoC at each time. The calculated SoC is stored in the charging measurement DB 14. The processing at the present step is unnecessary when the SoC is included in the measurement data in the charging measurement DB 14.

The feature calculator 12 calculates the gradient $\Delta V/\Delta SoC$ and the boost voltage Vsp as two features based on the charging measurement DB 14. Only one of the two features may be calculated.

The estimator 13 estimates the degradation state (SoH) of the rechargeable battery 202 based on the calculated two features or one of the features, the representative temperature, the initial SoC, and the degradation DB 15 (S34). The SoH indicates, for example, the ratio of capacitance relative to the rated capacitance.

The charging data searcher 21 specifies, based on the estimated SoH and the representative temperature, the corresponding charging data (SoC difference evaluation charging data) in the first charging data DB 24. The SoC (the reference SoC) corresponding to the evaluation target voltage is specified in the specified charging data. In addition, the SoC (evaluation target SoC) corresponding to the evaluation target voltage is specified in the charging measurement DB 14. The difference (SoC difference) between the reference SoC and the evaluation target SoC is calculated (S36).

It is determined whether the absolute value of the difference is smaller than the offset d (S37). When the absolute value is equal to or larger than the offset d (NO), the initial SoC and the SoC at each time are corrected in a direction in which the absolute value of the difference decreases (S38). Specifically, when the evaluation target SoC is higher than the reference SoC, the offset d is subtracted from the initial SoC and the SoC at each time. When the evaluation target SoC is lower than the reference SoC, the offset d is added to the initial SoC and the SoC at each time. Back at step S34, the degradation state is estimated again based on the corrected initial SoC. Thereafter, the same processing is repeated until it is determined at step S37 that the absolute value of the difference is smaller than the offset d.

When the absolute value of the difference becomes smaller than the offset d, the charging data (internal state estimation charging data) corresponding to the pair of the degradation state (SoH) and the representative temperature at this time is specified in the second charging data DB 25. Data such as the specified charging data, the battery information of the rechargeable battery 202, the degradation state, and the representative temperature is transferred to the internal state estimator 107.

The internal state estimator 107 estimates the internal state of the rechargeable battery 202 by CCA analysis based on the data received from the estimation result evaluator 106 and the analysis DB 31 (S40). Evaluation results such as the estimated internal state, the above-described degradation state, and the representative temperature are output to the display 104 (S41). The remaining lifetime may be calculated based on the degradation state, and data indicating the remaining lifetime may be output to the display 104 as a part of the evaluation results. The corrected data in the charging measurement DB 14 may be output to the display 104.

As described above, according to the present embodiment, it is possible to easily evaluate the degradation state and internal state of a rechargeable battery of an EV by using charging data of a charger on a road shoulder. The charging amount (SoC) stored in the EV is calculated by a control function of the EV through computation and has low accuracy or low reliability in some cases. In the present embodiment, the high accuracy of voltage measurement and the high accuracy of measurement of the electrical power increased amount are exploited to calculate each feature of the impulse charging according to the present embodiment, thereby highly accurately estimating the SoC. Accordingly, the degradation state and internal state of the rechargeable battery 202 can be highly accurately estimated. When the rechargeable battery is charged with a charger on a road shoulder, the charging is often performed in a high SoC range, and thus measurement data is potentially obtained only in the high range. However, since charging data in a SoC range wide enough for CCA analysis is stored in the second charging data DB 25 in association with the SoH and the like and CCA analysis is performed by using the charging data in accordance with the SoH estimated in the present embodiment, the internal state can be highly accurately estimated.

(Modification 1)

Each feature is calculated for the impulse charging C1 in the above-described embodiment, but the feature may be calculated for a plurality of impulse charging processes including the impulse charging C1 and C2. In this case, the feature may be calculated for each impulse charging process, and a statistical value of the calculated features may be used as the above-described feature of the embodiment. Examples of the statistical value include the average value, the median value, the minimum value, the maximum value, and the like.

The feature and the degradation state may be calculated for each impulse charging process, and a statistical value of the calculated degradation states may be calculated. Examples of the statistical value include the average value, the median value, the minimum value, the maximum value, and the like.

When the processing at the degradation state estimator 105 and the estimation result evaluator 106 is repeated, different impulse charging may be used at each repetition. For example, the impulse charging C1 is used first to calculate the feature and estimate the degradation state. When it is determined by the estimation result evaluator 106 that the degradation state estimation is to be performed again, the impulse charging C2 is used this time to calculate the feature and estimate the degradation state after correction of the initial SoC and the SoC at each time in measurement data. Thereafter, the same processing is repeated.

(Modification 2)

In the above-described embodiment, $\Delta V/\Delta SoC$ and Vsp are calculated as the features, but the features are not limited thereto. For example, one or both of $\Delta V$ and $\Delta SoC$ may be calculated as the features.

(Modification 3)

In the above-described embodiment, the evaluation processing automatically starts after charging of the rechargeable battery 202 ends, but the evaluation processing may start when a signal or data indicating an instruction from the user of the EV 200 or the administrator of a charger is input. For example, the evaluation processing may start when an evaluation button provided at the charger is pressed down.

(Modification 4)

The above-described embodiment is focused on the rechargeable battery 202 mounted on a vehicle, but the present technology is also applicable to a rechargeable battery mounted on an apparatus other than a vehicle, such as a robot, a drone, an industrial machine, or a user mobile terminal.

(Hardware Configuration)

Figure 12:
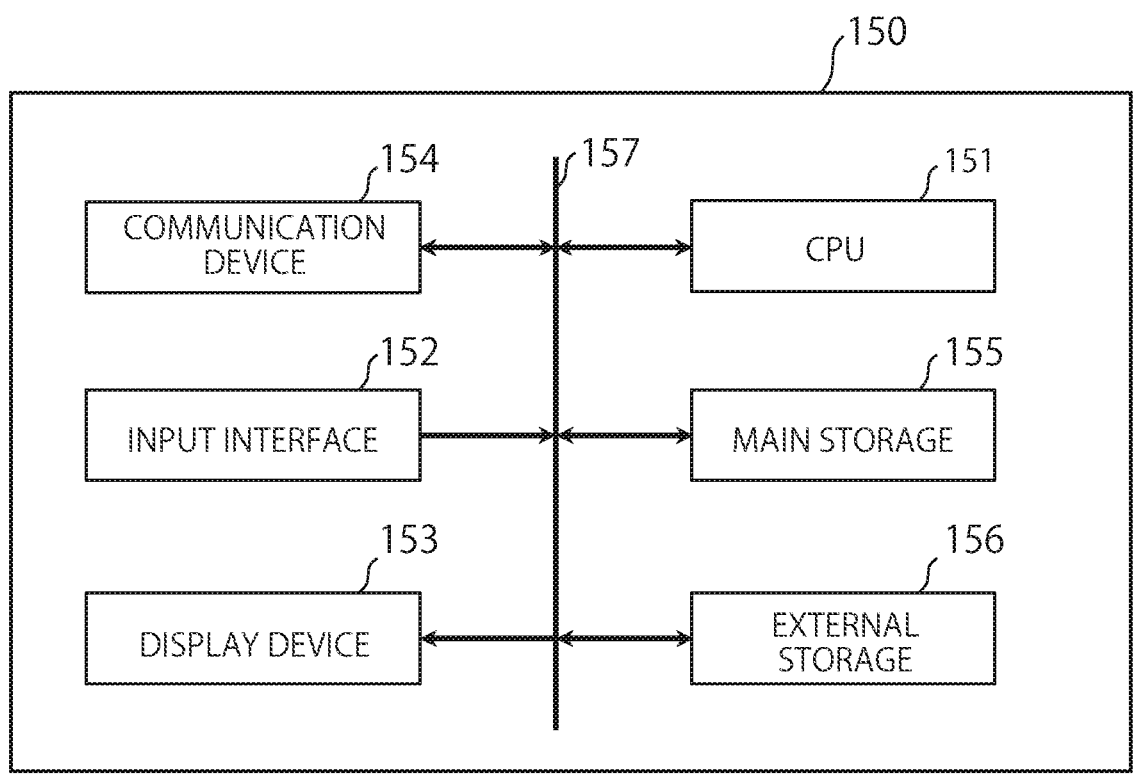
FIG. 12 is a diagram illustrating an exemplary hardware configuration of the rechargeable battery evaluation device according to the embodiment of the present invention.

FIG. 12 illustrates an exemplary hardware configuration of a rechargeable battery evaluation device according to the embodiment of the present invention. This hardware configuration is applicable to the above-described rechargeable battery evaluation device according to the embodiment. The hardware configuration in FIG. 12 is configured as a computer 150. The computer 150 includes a CPU 151, an input interface 152, a display device 153, a communication device 154, a main storage 155, and an external storage 156, and these are connected with one another to perform mutual communication therebetween through a bus 157.

The input interface 152 acquires measurement data of the rechargeable battery through a wire or the like. The input interface 152 may be an operation means through which a user provides an instruction to the rechargeable battery evaluation device. Examples of the operation means include a keyboard, a mouse, and a touch panel. The communication device 154 includes a wireless or wired communication means and performs wired or wireless communication with the EV 200. The measurement data may be acquired through the communication device 154. The input interface 152 and the communication device 154 may be configured as separate circuits such as integrated circuits or may be configured as one circuit such as an integrated circuit. The display device 153 is, for example, a liquid crystal display device, an organic EL display device, or a CRT display device. The display device 153 corresponds to the display 104 in FIG. 1.

The external storage 156 includes a storage medium such as a HDD, an SSD, a memory device, a CD-R, a CD-RW, a DVD-RAM, or a DVD-R. The external storage 156 stores a computer program for the CPU 151 as a processor to execute the function of each processing unit of the rechargeable battery evaluation device. In addition, the external storage 156 stores each DB included in the rechargeable battery evaluation device. In this example, only one external storage 156 is provided but a plurality of external storages 156 may be provided.

Under control of the CPU 151, the main storage 155 loads a control program stored in the external storage 156 and stores data necessary for execution of the computer program and data generated by execution of the computer program, and the like. The main storage 155 includes an optional memory or storage such as a transitory memory (for example, a DRAM or an SRAM) or a non-transitory memory (for example, a NAND flash memory or an MRAM). The function of each processing unit of the rechargeable battery evaluation device 100 is executed as the CPU 151 executes the control program loaded onto the main storage 155.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An information processing apparatus, comprising:
a charging controller configured to switch charging current of a rechargeable battery being charged with first current to second current and perform charging with the second current during a first duration which is one continuous period of time;
a first state estimator configured to
calculate a first voltage of the rechargeable battery during the first duration,
calculate a second voltage which is an average value between a voltage at a time before start of the first duration and a voltage at a time after end of the first duration,
calculate a feature of the rechargeable battery based on a difference between the first voltage and the second voltage, and
estimate a state of the rechargeable battery based on the feature; and
an estimation result evaluator configured to
specify, based on a plurality of pieces of first charging data in each of which a charging amount and a voltage are related with each other for a plurality of states, first charging data corresponding to the state estimated by the first state estimator, and
specify a reference charging amount that is a charging amount corresponding to an evaluation target voltage in the specified first charging data,
wherein the first state estimator specifies an evaluation target charging amount that is a charging amount of the rechargeable battery corresponding to the evaluation target voltage, and estimates the state of the rechargeable battery based on a difference between the reference charging amount and the evaluation target charging amount.

2. The information processing apparatus according to claim 1, wherein
the first state estimator
calculates a charging-amount change amount that is a difference between a charging amount of the rechargeable battery before charging with the second current and a charging amount of the rechargeable battery after charging with the second current, and
calculates a voltage change amount that is a difference between a voltage of the rechargeable battery before charging with the second current and a voltage of the rechargeable battery after charging with the second current, and
the feature is based on at least one of the voltage change amount and the charging-amount change amount.

3. The information processing apparatus according to claim 2, wherein the feature includes a ratio of the voltage change amount and the charging-amount change amount.

4. The information processing apparatus according to claim 1, wherein
the first state estimator calculates a first temperature based on a measured value of the temperature of the rechargeable battery,
the plurality of pieces of first charging data are associated with a plurality of battery temperatures, and
the estimation result evaluator specifies the first charging data based on the first temperature and the state.

5. The information processing apparatus according to claim 1, further comprising a data acquirer configured to acquire, from the rechargeable battery, information including an initial charging amount that is a charging amount of the rechargeable battery before charging, wherein
the state of the rechargeable battery is estimated based on the initial charging amount indicated by the information,
the initial charging amount indicated by the information is corrected based on a difference between the reference charging amount and the evaluation target charging amount, and
the state of the rechargeable battery is estimated based on the initial charging amount after the correction.

6. The information processing apparatus according to claim 1, wherein the charging controller generates the second current by adding third current to the first current.

7. The information processing apparatus according to claim 1, further comprising a charging driver configured to charge the rechargeable battery.

8. The information processing apparatus according to claim 1, wherein the second current is square-wave current.

9. The information processing apparatus according to claim 1, wherein the first state estimator estimates the state of the rechargeable battery based on measurement data of the rechargeable battery.

10. The information processing apparatus according to claim 1, wherein the state of the rechargeable battery is a degradation state of the rechargeable battery.

11. An information processing system, comprising:
an electric vehicle including a rechargeable battery; and
the information processing apparatus according to claim 1, the information processing apparatus being configured to evaluate the state of the rechargeable battery.

12. An information processing apparatus comprising:
a charging controller configured to switch charging current of a rechargeable battery being charged with first current to second current and perform charging with the second current during a first duration which is one continuous period of time;

a first state estimator configured to
calculate a first voltage of the rechargeable battery during the first duration,
calculate a second voltage which is an average value between a voltage at a time before start of the first duration and a voltage at a time after end of the first duration,
calculate a feature of the rechargeable battery based on a difference between the first voltage and the second voltage, and
estimate a state of the rechargeable battery based on the feature;
an estimation result evaluator configured to specify, based on a plurality of pieces of second charging data in each of which a charging amount and a voltage are related with each other for a plurality of states, second charging data corresponding to the estimated state;
a data acquirer configured to acquire information indicating the initial state of the rechargeable battery; and
a second state estimator configured to estimate an internal state of the rechargeable battery based on the information and the second charging data.

13. The information processing apparatus according to claim 12, wherein
the first state estimator calculates a first temperature based on a measured value of the temperature of the rechargeable battery,
the plurality of pieces of second charging data are associated with a plurality of battery temperatures, and
the estimation result evaluator specifies the second charging data based on the first temperature and the state.

14. An information processing method, comprising:
switching charging current of a rechargeable battery being charged with first current to second current and charging with the second current is performed during a first duration which is one continuous period of time;
calculating a first voltage of the rechargeable battery during the first duration;
calculating a second voltage which is an average value between a voltage at a time before start of the first duration and a voltage at a time after end of the first duration;
calculating a feature of the rechargeable battery based on a difference between the first voltage and the second voltage;
estimating a state of the rechargeable battery based on the feature of the rechargeable battery;
specifying first charging data corresponding to the state estimated based on a plurality of pieces of first charging data in each of which a charging amount and a voltage are related with each other for a plurality of states;
specifying a reference charging amount that is a charging amount corresponding to an evaluation target voltage in the specified first charging data; and
estimating an evaluation target charging amount that is a charging amount of the rechargeable battery corresponding to the evaluation target voltage and estimating a state of the rechargeable battery based on a difference between the reference charging amount and the evaluation target charging amount.

15. The information processing method according to claim 14, comprising:
calculating a charging-amount change amount that is a difference between a charging amount of the rechargeable battery before charging with the second current and a charging amount of the rechargeable battery after charging with the second current,
calculating a voltage change amount that is a difference between a voltage of the rechargeable battery before charging with the second current and a voltage of the rechargeable battery after charging with the second current, and
the feature is based on at least one of the voltage change amount and the charging-amount change amount.

16. The information processing method according to claim 14, wherein the feature includes a ratio between the voltage change amount and the charging-amount change amount.

17. The information processing method according to claim 14, comprising:
calculating a first temperature based on a measured value of the temperature of the rechargeable battery,
the plurality of pieces of first charging data being associated with a plurality of battery temperatures, and
the method comprising specifying the first charging data based on the first temperature and the state.

18. The information processing method according to claim 16, comprising:
acquiring information including an initial charging amount that is a charging amount of the rechargeable battery before charging is acquired from the rechargeable battery,
estimating a state of the rechargeable battery based on the initial charging amount indicated by the information,
correcting the initial charging amount indicated by the information based on a difference between the reference charging amount and the evaluation target charging amount, and
estimating the state of the rechargeable battery based on the initial charging amount after the correction.

19. The information processing method according to claim 14, comprising generating the second current by adding third current on the first current.

20. The information processing method according to claim 14, wherein the second current is square-wave current.

21. The information processing method according to claim 14, comprising estimating the state of the rechargeable battery based on measurement data of the rechargeable battery.

22. The information processing method according to claim 14, wherein the state of the rechargeable battery is a degradation state of the rechargeable battery.

23. An information processing method, comprising:
switching charging current of a rechargeable battery being charged with first current to second current and charging with the second current is performed during a first duration which is one continuous period of time;
calculating a first voltage of the rechargeable battery during the first duration;
calculating a second voltage which is an average value between a voltage at a time before start of the first duration and a voltage at a time after end of the first duration;
calculating a feature of the rechargeable battery based on a difference between the first voltage and the second voltage;
estimating a state of the rechargeable battery based on the feature of the rechargeable battery:
specifying second charging data corresponding to the estimated state based on a plurality of pieces of second charging data in each of which a charging amount and a voltage are related with each other for a plurality of states, acquiring information indicating the initial state of the rechargeable battery, and estimating the internal state of the rechargeable battery based on the information and the second charging data.

24. The information processing method according to claim 23, comprising:

calculating a first temperature based on a measured value of the temperature of the rechargeable battery, the plurality of pieces of second charging data being associated with a plurality of battery temperatures, and specifying the second charging data based on the first temperature and the state.

* * * * *